US009627490B1

United States Patent
Eom et al.

(10) Patent No.: US 9,627,490 B1
(45) Date of Patent: Apr. 18, 2017

(54) EPITAXIAL GROWTH OF HIGH QUALITY VANADIUM DIOXIDE FILMS WITH TEMPLATE ENGINEERING

(71) Applicant: Wisconsin Alumni Research Foundation, Madison, WI (US)

(72) Inventors: Chang-Beom Eom, Madison, WI (US); Daesu Lee, Madison, WI (US)

( * ) Notice: Subject to any disclaimer, the term of this patent is extended or adjusted under 35 U.S.C. 154(b) by 0 days.

(21) Appl. No.: 14/974,178

(22) Filed: Dec. 18, 2015

(51) Int. Cl.
| | |
|---|---|
| *H01L 29/24* | (2006.01) |
| *H01L 21/02* | (2006.01) |
| *H01L 21/36* | (2006.01) |
| *H03K 17/56* | (2006.01) |
| *H01L 29/78* | (2006.01) |
| *H01L 29/66* | (2006.01) |
| *H01L 29/10* | (2006.01) |
| *H03K 17/687* | (2006.01) |
| *H01L 45/00* | (2006.01) |
| *H03K 17/51* | (2006.01) |

(52) U.S. Cl.
CPC ........ *H01L 29/24* (2013.01); *H01L 21/02414* (2013.01); *H01L 21/02483* (2013.01); *H01L 21/02565* (2013.01); *H01L 29/1033* (2013.01); *H01L 29/1079* (2013.01); *H01L 29/66969* (2013.01); *H01L 29/78* (2013.01); *H01L 45/1206* (2013.01); *H01L 45/146* (2013.01); *H03K 17/51* (2013.01); *H03K 17/687* (2013.01)

(58) Field of Classification Search
CPC ..... H01L 29/24; H01L 29/78; H01L 29/1033; H01L 29/1079; H01L 29/66969; H01L 21/02414; H01L 21/02483; H01L 21/02565; H01L 45/146; H01L 45/1206; H03K 17/687; H03K 17/51

USPC .............. 257/3, 43, 108, 295, 421, E21.009, 257/E21.021, E21.461, E27.104, E29.1; 327/365; 365/145; 204/192.11, 192.15, 204/192.34; 438/99, 104, 381
See application file for complete search history.

(56) References Cited

U.S. PATENT DOCUMENTS

| | | | |
|---|---|---|---|
| 3,547,594 A | 12/1970 | Teeg | |
| 6,653,704 B1 | 11/2003 | Gurney | |
| 7,583,176 B1 | 9/2009 | Robinson | |
| 8,864,957 B2 | 10/2014 | Ramanathan | |
| 8,871,363 B2 | 10/2014 | Tsuchiya | |
| 2008/0032441 A1* | 2/2008 | Hirai | ...................... H01L 51/00 438/99 |
| 2009/0213636 A1* | 8/2009 | Koinuma | ............... B01J 23/002 365/145 |

(Continued)

OTHER PUBLICATIONS

A. Atrei et al., Composition and structure of ultrathin vanadium oxide layers deposited on SnO2(110), Surface Science 513, 2002, pp. 149-162.

(Continued)

*Primary Examiner* — Dao H Nguyen
(74) *Attorney, Agent, or Firm* — Bell & Manning, LLC

(57) ABSTRACT

Layered oxide structures comprising an overlayer of high quality $VO_2$ and methods of fabricating the layered oxide structures are provided. Also provided are high-speed switches comprising the layered structures and methods of operating the high-speed switches. The layered oxide structures include high quality $VO_2$ epitaxial films on isostructural $SnO_2$ growth templates.

15 Claims, 12 Drawing Sheets

(56) References Cited

U.S. PATENT DOCUMENTS

| | | | | |
|---|---|---|---|---|
| 2010/0314617 | A1* | 12/2010 | Ito | B81C 1/00111 257/43 |
| 2011/0151639 | A1* | 6/2011 | Lim | C01G 23/047 438/381 |
| 2011/0175047 | A1* | 7/2011 | Ramanathan | H01L 49/003 257/2 |
| 2011/0181345 | A1* | 7/2011 | Ramanathan | G11C 11/16 327/509 |
| 2014/0266391 | A1* | 9/2014 | Parkin | H01L 45/04 327/365 |
| 2015/0340607 | A1* | 11/2015 | Ramanathan | G11C 11/16 438/104 |

OTHER PUBLICATIONS

Hyun Koo et al., Effect of Oxide Buffer Layer on the Thermochromic Properties of VO2 Thin Films, Journal of Materials Engineering and Performance, vol. 22 (12), Oct. 1, 2013, pp. 3967-3972.

R. Molaei et al., A microstructural approach toward the effect of thickness on semiconductor-to-metal transition characteristics of VO2 epilayers, Journal of Applied Physics 115, 164311, Apr. 29, 2014, pp. 1-8.

Zongtao Zhang et al., Solution-based fabrication of vanadium dioxide on F:SnO2 substrates with largely enhanced thermochromism and low-emissivity for energy-saving applications, Energy & Environmental Science, DOI: 10.1039/c1ee02092g, Sep. 8, 2011, pp. 1-8.

Matthias Batzill et al., The surface and materials science of tin oxide, Progress in Surface Science 79, 2005, pp. 47-154.

O.M. Osmolovskaya et al., Synthesis of Vanadium Dioxide Thin Films and Nanopowders: A Brief Review, Rev. Adv. Mater. Sci. 38, 2014, pp. 70-74.

Tsung-Han Yang et al., On growth of epitaxial vanadium oxide thin film on sapphire (0001), Journal of Materials Research, vol. 25, Issue 03, Mar. 2010, pp. 422-426.

Feliks Chudnovskiy et al., Switching device based on first-order metal insulator transition induced by external electric field, Future Trends in Microelectronics: the Nano Millennium, 2002, pp. 148-155.

Gisia Beydaghyan et al., High contrast thermochromic switching in vanadium dioxide (VO2) thin films deposited on indium tin oxide substrates, Thin Solid Films 522, Jul. 28, 2012, pp. 204-207.

A. Atrei et al., XPD Study of Vanadium Oxide Films Grown on the SnO2(110) Surface, Surface Review and Letters, vol. 6, No. 6, 1999, pp. 1187-1193.

You Zhou et al., Voltage-triggered Ultra-fast Metal-insulator Transition in Vanadium Dioxide Switches, IEEE Electron Device Letters, 34, 202, 2013, pp. 1-7.

Yaoming Sun et al., Anisotropic vanadium dioxide sculptured thin films with superior thermochromic properties, Scientific Reports 3:2756, Sep. 25, 2013, pp. 1-10.

Mikhail Esaulkov et al., Emission of terahertz pulses from vanadium dioxide films undergoing metal-insulator phase transition, Optica vol. 2, No. 9, Sep. 4, 2015, pp. 790-796.

Zheng Yang et al., Oxide Electronics Utilizing Ultrafast Metal-Insulator Transitions, Annu. Rev. Mater Res. 41, Mar. 30, 2011, pp. 337-367.

* cited by examiner

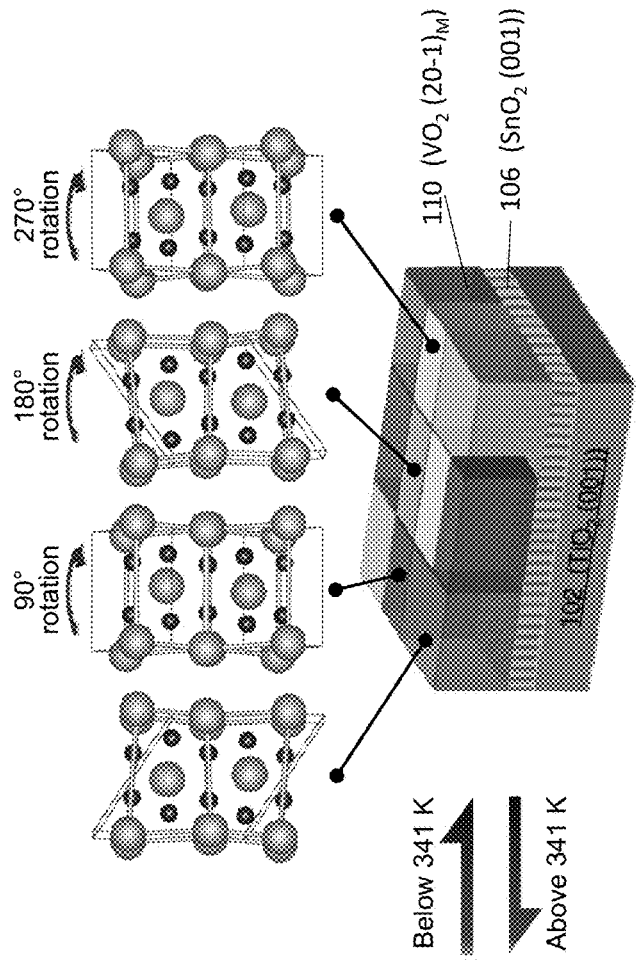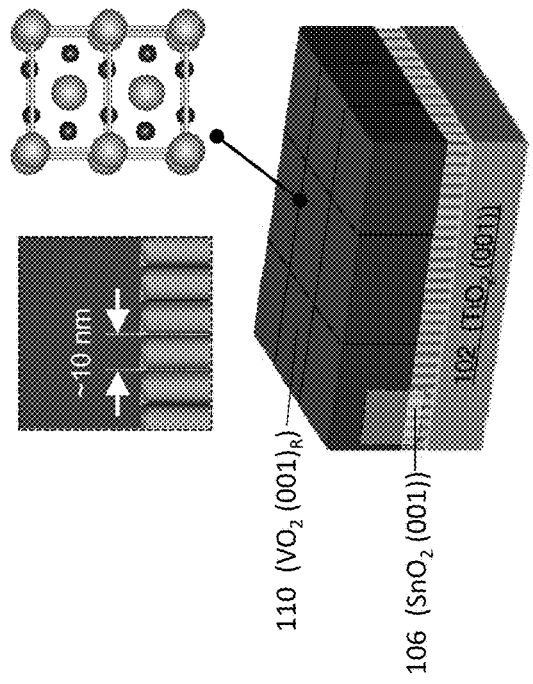
FIG. 1

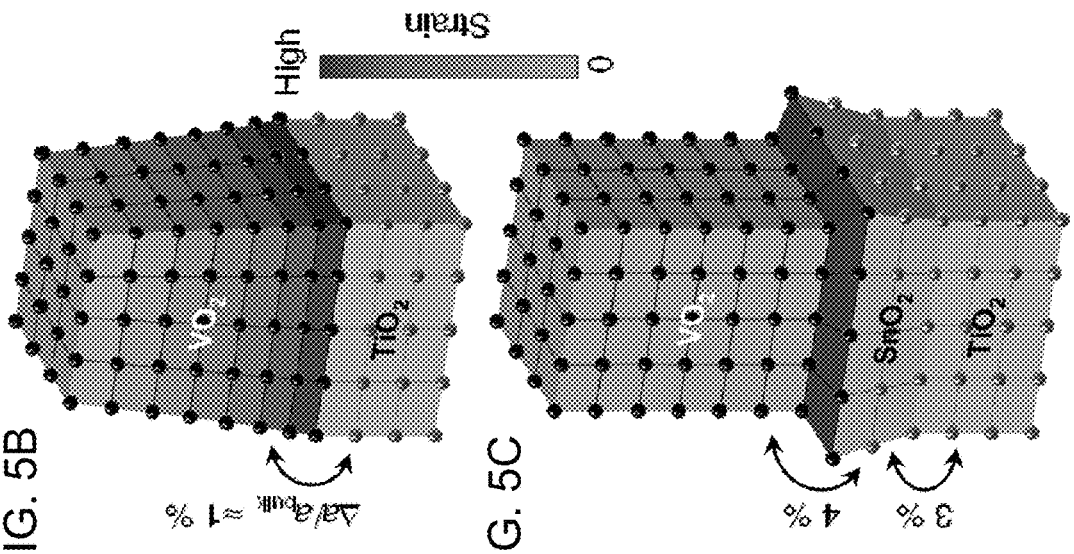
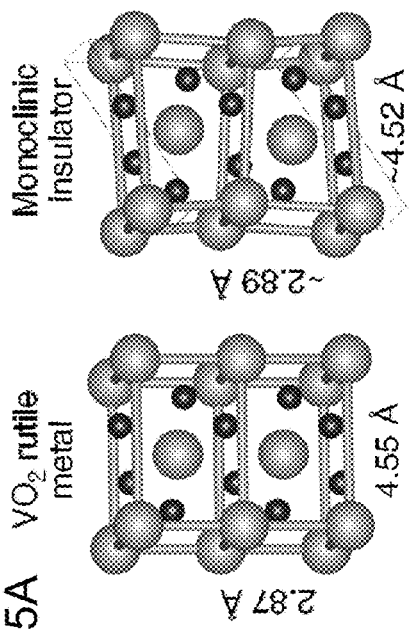
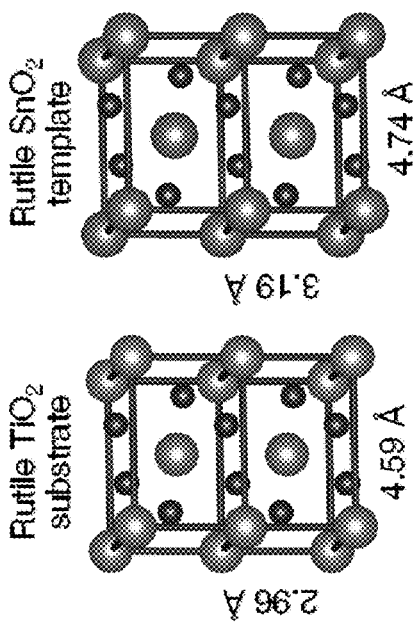

FIG. 7C
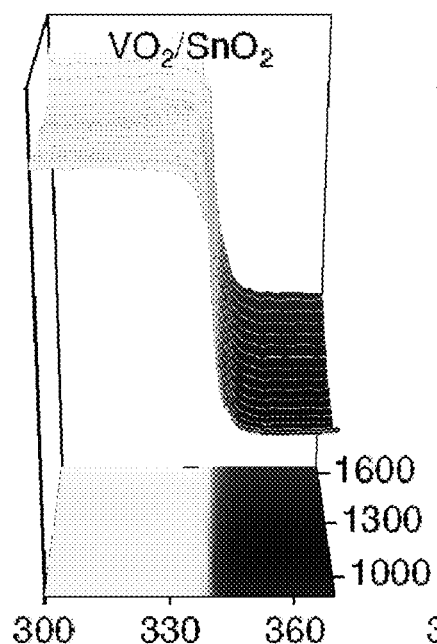
FIG. 7D
FIG. 7E
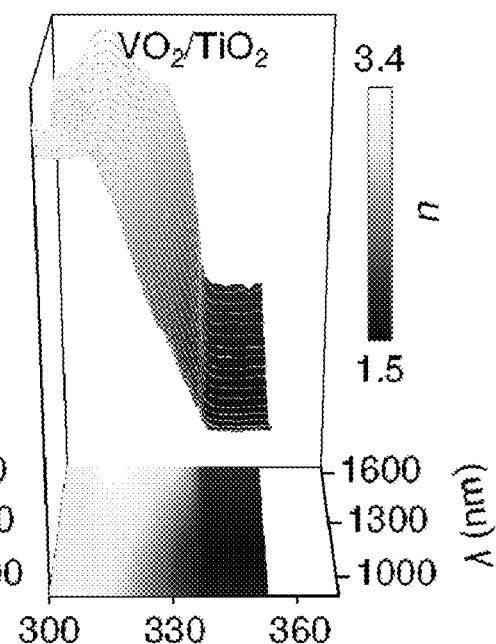
FIG. 7F

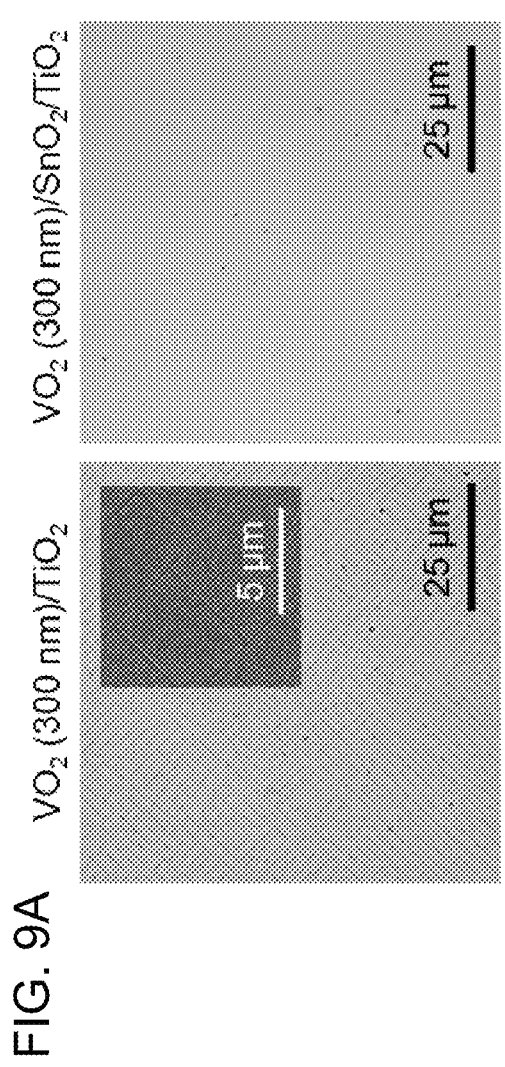
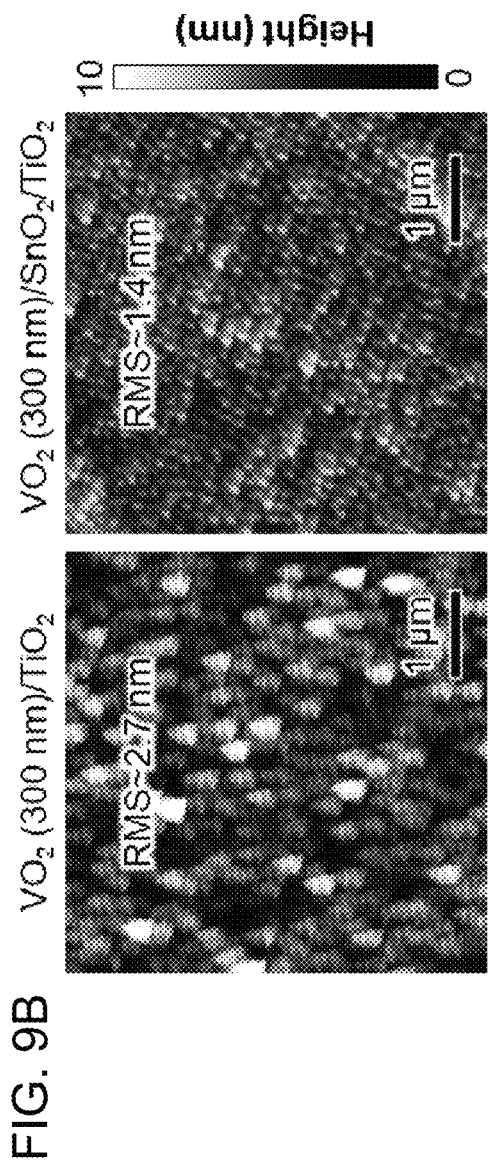
FIG. 9A
FIG. 9B

EPITAXIAL GROWTH OF HIGH QUALITY VANADIUM DIOXIDE FILMS WITH TEMPLATE ENGINEERING

REFERENCE TO GOVERNMENT RIGHTS

This invention was made with government support under N00014-13-1-0183 awarded by the United States Navy. The government has certain rights in the invention.

BACKGROUND $VO_2$ is a fascinating correlated-oxide material that possesses strong coupling among its charge, spin, orbital, and lattice degrees of freedom. $VO_2$ exhibits a sharp metal-insulator transition (MIT) above room temperature (i.e., transition temperature $T_{MIT}$ of ~341 K in bulk) with an accompanying structural-phase transition from high-temperature rutile to low-temperature monoclinic structures. This unique property coupled with an almost five-orders-of-magnitude conductivity change (in single-crystal bulks) across the transition make $VO_2$ a compelling model system for scientific and technological endeavors. Furthermore, the ultrafast nature of $VO_2$'s MIT gives it diverse potential applications in materials physics and solid-state electronics. Critical to any practical application for $VO_2$, as well as to exploration of its fundamental physics, is the ability to grow high-quality epitaxial thin films.

Yet it has been difficult to achieve heteroepitaxy in $VO_2$ thin films due to several intrinsic problems that hamper reliable and predictable $VO_2$ device performance. Genuine epitaxial growth without rotational domain variants has been achieved with a $TiO_2$ substrate, owing to the rutile, isostructural symmetry between $VO_2$ and $TiO_2$ at their respective growth temperatures. Despite structural compatibility, though, there is a slight lattice mismatch of ~1.0% between $VO_2$ and $TiO_2$, causing a gradual strain relaxation when a film's thickness exceeds a critical value (i.e., ~20 nm), and this results in severe inhomogeneities throughout the films and in a broad MIT. Even worse, this strain relaxation is accompanied by the formation of cracks that degrade $VO_2$'s MIT features, including its magnitude of resistance change across the MIT.

SUMMARY

Layered oxide structures comprising an overlayer of high quality $VO_2$ and methods of fabricating the layered oxide structures are provided. Also provided are high-speed switches comprising the layered structures and methods of operating the high-speed switches.

One embodiment of a layered oxide structure comprises: (a) a substrate comprising single-crystalline $TiO_2$; (b) an intervening layer comprising columnar, crystalline domains of rutile $SnO_2$ on the substrate, wherein the columnar, crystalline domains of $SnO_2$ have an epitaxial relationship with the single-crystalline $TiO_2$; and (c) an overlayer comprising crystalline domains of $VO_2$ on the intervening layer, wherein the crystalline domains of $VO_2$ have an epitaxial relationship with the columnar, crystalline domains of rutile $SnO_2$. In the structure, the $VO_2$ has a metal-insulator phase transition critical temperature, below which the $VO_2$ has a monoclinic crystal structure and above which the $VO_2$ has a rutile crystal structure.

One embodiment of a switch comprises: a body comprising: (a) a substrate comprising single-crystalline $TiO_2$; (b) an intervening layer comprising columnar, crystalline domains of rutile $SnO_2$, wherein the columnar, crystalline domains of $SnO_2$ have an epitaxial relationship with the single-crystalline $TiO_2$; and (c) a channel layer comprising crystalline domains of $VO_2$ on the intervening layer, wherein the crystalline domains of $VO_2$ have an epitaxial relationship with the columnar, crystalline domains of rutile $SnO_2$. The $VO_2$ of the channel has a metal-insulator phase transition critical temperature, below which the $VO_2$ has a monoclinic crystal structure and above which the $VO_2$ has a rutile crystal structure. The switch also includes: (d) a first electrically conducting contact in electrical communication with a first area of the channel layer; (e) a second electrically conducting contact in electrical communication with a second area of the channel layer; and (f) an external stimulus source, such as an external voltage source, configured to apply a metal-insulator phase transition-inducing external stimulus to the channel layer.

One embodiment of a method for operating the switch comprises: applying an external voltage from an external voltage source to the first electrically conducting contact, wherein the external voltage induces the $VO_2$ to undergo a phase transition from the electrically insulating monoclinic crystal structure to the electrically conducting rutile crystal structure.

The switch can be a field effect switch comprising: a body comprising: (a) a substrate comprising single-crystalline $TiO_2$; (b) an intervening layer comprising columnar, crystalline domains of rutile $SnO_2$, wherein the columnar, crystalline domains of $SnO_2$ have an epitaxial relationship with the single-crystalline $TiO_2$; and (c) a channel layer comprising crystalline domains of $VO_2$ on the intervening layer, wherein the crystalline domains of $VO_2$ have an epitaxial relationship with the columnar, crystalline domains of rutile $SnO_2$. The $VO_2$ of the channel has a metal-insulator phase transition critical temperature, below which the $VO_2$ has a monoclinic crystal structure and above which the $VO_2$ has a rutile crystal structure. The field effect switch further includes: (d) a source; (e) a drain, wherein the source and drain are connected by the channel layer; (f) a gate stack comprising: a gate oxide on the channel layer and a gate contact on the gate oxide; and (g) an external voltage source configured to apply a metal-insulator phase transition-inducing external voltage to the gate contact.

One embodiment of a method for operating the field effect switch comprises: applying a gate voltage from the external voltage source to the gate contact, wherein the external voltage induces the $VO_2$ to undergo a phase transition from the electrically insulating monoclinic crystal structure to the electrically conducting rutile crystal structure.

One embodiment of a method of making a layered oxide structure comprises: epitaxially growing a layer of columnar, crystalline domains of rutile $SnO_2$, on a substrate comprising single-crystalline $TiO_2$; and epitaxially growing an overlayer comprising crystalline domains of $VO_2$ on the layer of columnar, crystalline domains of rutile $SnO_2$.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1. Schematic diagram showing a multilayered structure comprising a $VO_2$ overlayer below its critical phase transition temperature (right) and above its critical phase transition temperature (left). The rutile (left) and monoclinic (right) crystal structures of the $VO_2$ are shows above the multilayered structures.

FIG. 5A. Atomic structures of rutile, metallic $VO_2$ (upper left); monoclinic, insulating $VO_2$ (upper right); rutile $TiO_2$ (lower left); and rutile $SnO_2$ (lower right) (corresponding lattice parameters are also shown). FIG. 5B. Schematic diagram showing the expected lattice-strain profiles for epitaxial $VO_2$ films on $TiO_2$ without a, $SnO_2$ template. FIG. 5C. Schematic diagram showing the expected lattice-strain profiles for epitaxial $VO_2$ films on $TiO_2$ with a $SnO_2$ template.

FIG. 7C. Refractive index n as function of temperature and $\lambda$ for the 300-nm-thick $VO_2/SnO_2/TiO_2$ film. FIG. 7D. Extinction coefficient k as function of temperature and $\lambda$ for the 300-nm-thick $VO_2/SnO_2/TiO_2$ film. FIG. 7E. Refractive index n as function of temperature and $\lambda$ for the 300-nm-thick $VO_2/TiO_2$ film. FIG. 7F. Extinction coefficient k as function of temperature and $\lambda$ for the 300-nm-thick $VO_2/TiO_2$ film.

FIG. 9A. Microscopic images of the $VO_2$ films' surfaces for $VO_2$ grown on $TiO_2$ (left) and on $SnO_2/TiO_2$ (right); the image in the inset shows a film surface as observed with a scanning electron microscopy (SEM); prior to SEM imaging, the film surface was chemically etched to observe the resultant cracks more clearly. FIG. 9B. AFM images of the $VO_2$ films' surfaces for $VO_2$ grown on $TiO_2$ (left) and $SnO_2/TiO_2$ (right).

DETAILED DESCRIPTION

Figure 2:
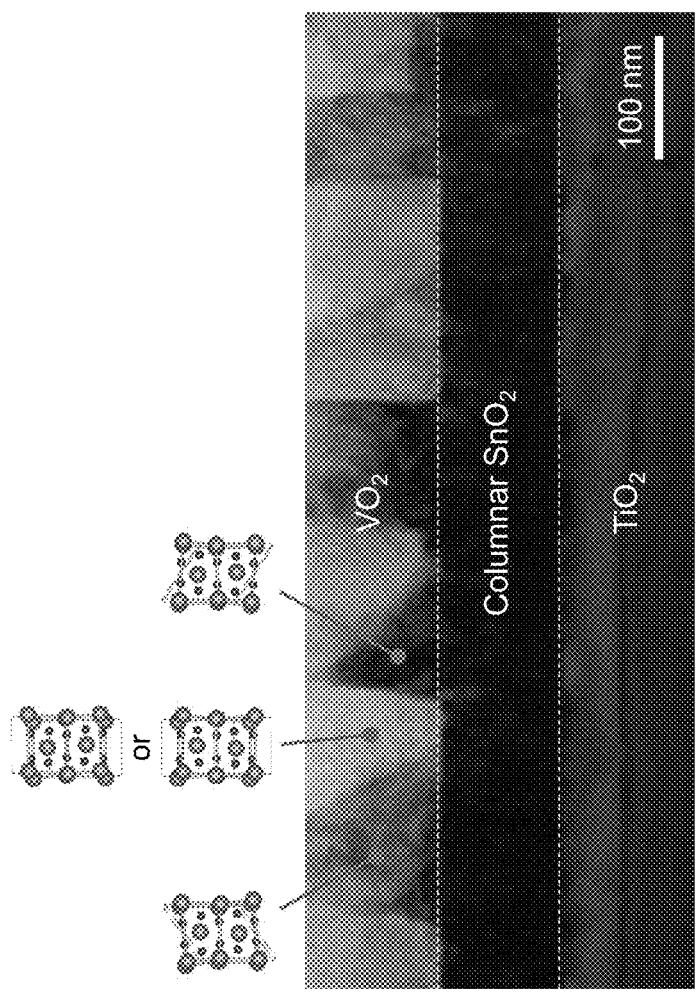
FIG. 2. TEM of a multilayered structure comprising a $VO_2$ overlayer below its critical phase transition temperature, with different rotational orientations of the $VO_2$ domains indicated.

Layered oxide structures comprising an overlayer of high quality $VO_2$ and methods of fabricating the layered oxide structures are provided. Also provided are high-speed switches comprising the layered structures and methods of operating the high-speed switches.

The layered oxide structures comprise high quality $VO_2$ epitaxial films grown on a symmetrically isostructural $SnO_2$ template. The lattice mismatch between the $VO_2$ and $SnO_2$ produces small, well-connected domains of $VO_2$ having the same crystal structure in the epitaxial film and confines severe structural defects (e.g., strain gradients and cracks) to the area near the $SnO_2/VO_2$ interface. This leads to homogeneous, bulk-like lattices in the $VO_2$ film, without compromising the film's epitaxial nature. This structural homogeneity also enables homogeneous electronic and chemical states throughout the films, which is highly desirable for creating reliable, high performance devices, such as high-speed switches.

The $VO_2$ in the epitaxial films is characterized by a metal-insulator phase transition critical temperature. Below this critical temperature, the $VO_2$ in the epitaxial crystalline domains has an electrically insulating monoclinic crystal structure. As the $VO_2$ is heated to and above its critical temperature, the crystal structure transitions to a metallic conducting rutile crystal structure. In the $VO_2$ films, the transition is very sharp and is accompanied by a large decrease in the films' electrical resistance. In addition, the small crystalline domains in the $VO_2$ films help them to absorb the stresses and strains that accompany the phase transition, enabling the films to undergo many phase transition cycles without cracking. As a result, the $VO_2$ films are well suited for switching applications. For example, the $VO_2$ films can be used in electronic switches and optoelectronic switches in circuits, including integrated circuits, for memory devices (e.g., CMOS chips) and communication devices.

One embodiment of a layered structure comprising a $VO_2$ overlayer is shown schematically in FIG. 1. The right side the figure shows the structure at a first temperature that is below the phase transition critical temperature ($T_{crit}$) and the left side of the figure shows the structure at a second temperature that is above the $T_{crit}$. The structure comprises a single-crystalline, rutile $TiO_2$ substrate 102 having an exposed $TiO_2$ (001) growth surface. A template layer 106 comprising columnar crystalline domains of rutile $SnO_2$ is disposed on $TiO_2$ substrate 102. The columnar, crystalline domains of rutile $SnO_2$ are grown epitaxially and, therefore, have an epitaxially relationship with the underlying $TiO_2$. Rutile $SnO_2$ domains have an exposed (001) surface on which an overlayer 110 comprising a plurality of connected crystalline $VO_2$ domains of is disposed. Epitaxial growth of the $SnO_2$ and $VO_2$ can be accomplished using, for example, pulsed laser deposition (PLD) as illustrated in the Example.

The lattice mismatch between the $TiO_2$ substrate and the $SnO_2$ results in the epitaxial, nanoscale, crystalline columnar domains in the $SnO_2$ growing upward from the $TiO_2$ growth surface. These domains, which have the same crystal structure (rutile) and orientation nucleate separately on the growth surface and grow together to a growth template that is isostructural with the subsequently grown VO$_2$ at growth temperatures above T$_{crit}$. As such, the SnO$_2$ films are not polycrystalline films in which a plurality of crystal domains are oriented randomly within the film. As used herein, the term nanoscale columnar domains refers to columnar domains having average cross-sectional diameters that are no greater than 200 nm. This includes columnar domains having average cross-sectional diameters that are no greater than 100 nm; no greater than 50 nm; and no greater than 20 nm. For example, in some embodiments of the SnO$_2$ films, the columnar domains have average cross-sectional diameters in the range from about 5 nm to about 10 nm. The thickness of the SnO$_2$ layer is typically in the range from about 100 nm to about 300 nm, but thicknesses outside of this range can be used.

The lattice mismatch between the SnO$_2$ and the VO$_2$ limits the size of the epitaxially grown VO$_2$ domains and concentrates and/or confines any cracks in the VO$_2$ film to a small volume near the SnO$_2$/VO$_2$ interface, while the remainder of the VO$_2$ may be crack- and strain-free. This is advantageous because it allows the VO$_2$ layers to be grown to commercially practical thicknesses without any significant cracking beyond the lowermost portion of the layer. By way of illustration only, in some embodiments of the layered structures, the VO$_2$ layer has a thickness of at least 100 nm. This includes layered structures having a VO$_2$ layer thicknesses of at least 200 nm and further includes layered structures having a VO$_2$ layer thicknesses of at least 300 nm. For example, in some embodiments, the VO$_2$ layer thickness is in the range from about 100 nm to about 500 nm. This includes embodiments in which the VO$_2$ layer thickness is in the range from about 200 nm to about 400 nm. In each of these embodiments, the cracks and/or strains (if present at all) may be confined to within a few nanometers (for example, 10 nm or fewer, including 5 nm or fewer) of the SnO$_2$/VO$_2$ interface.

The small size of the VO$_2$ domains helps the VO$_2$ film to absorb the stresses and strains of the MIT, which reduces cracking during phase change cycling and improves and sustains device performance. As used here, the size of the domains refers to the largest cross-sectional width of the domains, where the width dimension is perpendicular to the thickness dimension. In some embodiments of the layered structures, the average width of the VO$_2$ domains is no greater than about 500 nm. This includes embodiments in which the average width of the VO$_2$ domains is no greater than about 400 nm and further includes embodiments in which the average width of the VO$_2$ domains is no greater than about 300 nm. The VO$_2$ domains are well-connected, have a common crystal structure and an epitaxial relationship with the underlying SnO$_2$. At temperatures below T$_{crit}$, the VO$_2$ has a monoclinic crystal structure and is electrically insulating. The monoclinic VO$_2$ domains can have four different rotational orientations that are rotated by 90° from each other in the plane of the film. The different rotations domains are represented by area of different shading in overlayer 110 on the right side of FIG. 1. The four different rotational domain variants of the monoclinic VO$_2$ are shown in the upper right side of FIG. 1. At temperatures above T$_{crit}$, the VO$_2$ has a tetragonal rutile crystal structure and acts as an electrical conductor. The rutile crystal structure is shown in the upper left side of FIG. 1.

The T$_{crit}$ for the VO$_2$ in the overlayer is greater than room temperature (i.e., greater than 300 K). Typically, the T$_{crit}$ is greater than 340 and in the range from about 338 to about 345 K (e.g., about 340 to 343 K, including about 341 K). (Unless otherwise indicated, the phase transition critical temperatures referred to in this disclosure refer to the critical temperature in the absence of an applied external field or strain.)

The high quality VO$_2$ films grown on SnO$_2$ template layers can be characterized by their sharp metal-insulator phase transitions, where the sharpness of a transition is characterized by the full width at half maximum (FWHM) of the derivative curve of a heating curve, as illustrated in the Example. Some embodiments of the VO$_2$ films have a phase transition sharpness of 2 K or less. This includes VO$_2$ films having a phase transition sharpness of 1.5 K or less and further includes VO$_2$ films having a phase transition sharpness of 1 K or less. These sharp transition can be achieved even in films with thicknesses above 100 nm, above 200 nm, and above 300 nm.

The monoclinic to rutile (insulating to conducting) phase transition is accompanied by a large drop in the vanadium dioxide's magnitude of electrical resistance (ΔR), which can be measured as described in the Example. Some embodiments of the VO$_2$ films have a ΔR of at least 2 orders of magnitude. This includes VO$_2$ films having a ΔR of at least 3 orders of magnitude and further includes VO$_2$ films having a ΔR of at least 4 orders of magnitude.

The layered structure can be used as a switch by heating the VO$_2$ above its T$_{crit}$ to trigger the phase transition. Devices configured to induce or monitor this heating-induced switching can be used as thermal switches and thermal sensors. Alternatively, an external stimulus, such as an electric field, an optical field, a mechanical strain, or a combination thereof, can be applied to the VO$_2$ to induce the phase transition. These external stimuli shift the critical temperature for the MIT and induce the reversible phase transition, which changes the resistance (and, therefore, conductance) of the VO$_2$, thereby modulating current flow through the material. Devices configured for field-induced switching can be used as high-speed switches for a variety of electronic, optical, and optoelectronic applications. A basic embodiment of a two-terminal switch comprising the layered structure is shown in the schematic diagram of FIG. 3. This switch is designed to undergo an electric field-induced crystalline phase transition. The switch comprises a channel layer comprising the crystalline domains of VO$_2$ 302, a first electrically conducting contact 304 in electrical communication with layer 302, and a second electrically conducting contact 306 in electrical communication with layer 302. The switch embodiment shown here also includes a dielectric substrate 307 comprising the SnO$_2$ 308 and TiO$_2$ 309 layers of the layered structure. The crystalline phase change in the VO$_2$ channel layer can be triggered by the application of an external electric field. This is typically accomplished by applying an external voltage from an external voltage source to first electrically conducting contact 304. If the magnitude of the applied voltage is meets a certain voltage threshold, it will induce the phase change and trigger the switch.

Figure 4:
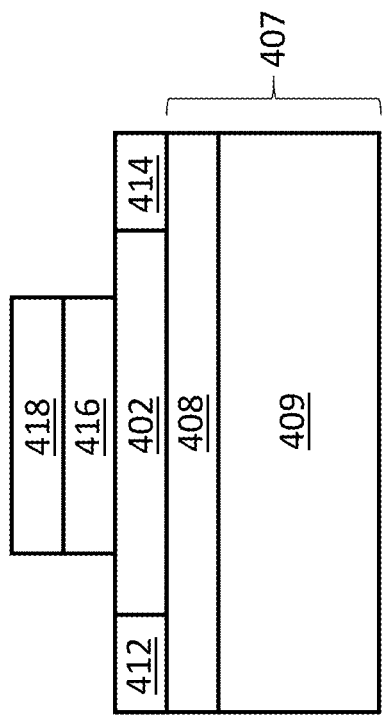
FIG. 4. Schematic diagram of a three-terminal switch with a $VO_2$ channel layer.

FIG. 4 is a schematic diagram of the three-terminal field effect switch that incorporates a VO$_2$ layer as a channel. The switch comprises a source 412, a drain 414, and a channel layer comprising the crystalline domains of VO$_2$ 402 disposed between source 412 and drain 414. A gate stack comprising a gate dielectric 416 and a gate contact 418 is disposed on channel layer 402. The field effect switch also includes a dielectric substrate 407 comprising the SnO$_2$ 408 and TiO$_2$ 409 layers of the layered structure. The crystalline phase change in the VO$_2$ channel layer can be triggered by the application of a gate voltage, such as a negative gate voltage, to gate contact 418. If the applied gate voltage is greater than the threshold voltage, it will induce the phase change and trigger the switch.

Figure 3:
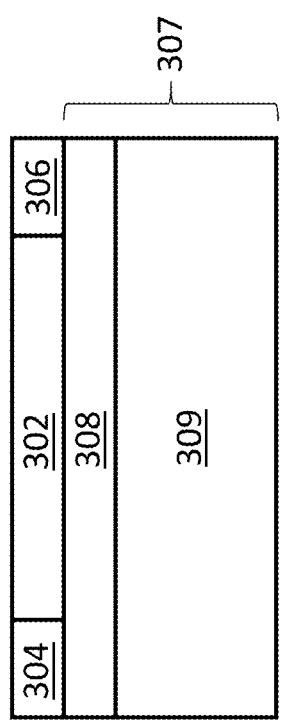
FIG. 3. Schematic diagram of a two-terminal switch with a $VO_2$ channel layer.

Although the switches shown in FIGS. 3 and 4 include the $SnO_2$ template layer and $TiO_2$ substrate upon which the $VO_2$ layer is grown, it is also possible to remove one or both of these layers after $VO_2$ layer growth and then transfer the $VO_2$ layer onto another support substrate, which may be an electrically conducting (metallic), semiconducting, or electrically insulating substrate.

EXAMPLE

In this example, $VO_2$ films were grown on an $SnO_2$-templated $TiO_2$ (001) substrate. $SnO_2$ is insulating and has a rutile symmetry isostructural with $VO_2$ at its growth temperature, making it relevant as a template for epitaxial $VO_2$ growth (FIG. 5A). A large lattice mismatch (≥4.2%) between $VO_2$ and $SnO_2$ results in an abrupt strain relaxation at the interface region within a few nanometers. As a result, severe structural defects, including strain gradient, were confined only near the interface between the $VO_2$ and $SnO_2$, leading to homogeneous, bulk-like lattices in the $VO_2$ film (FIG. 5C) and a sharp MIT above room temperature. Additionally, the low solid solubility between $VO_2$ and $SnO_2$ significantly enhanced the materials' chemical sharpness at the interface by reducing interfacial intermixing. Thus, thin-film epitaxy using an $SnO_2$ template is a suitable process for producing homogeneous, crystalline, crack-free $VO_2$ films.

Materials and Methods

Crystalline $VO_2$ epitaxial thin films were grown on (001) $TiO_2$ substrates using the pulsed laser deposition (PLD) method. Before deposition, low miscut 0.1°) $TiO_2$ substrates were cleaned by sonicating with acetone and then rinsing with isopropanol. An $SnO_2$ epitaxial layer with a thickness of 100 nm was deposited as a bottom template on the $TiO_2$ substrate. A KrF excimer laser ($\lambda$=248 nm) beam was focused on $SnO_2$ and $V_2O_5$ ceramic targets to an energy density of ~2.0 J/cm$^2$ and pulsed at 5 Hz (for $SnO_2$ layer) or 10 Hz (for $VO_2$ layer). $SnO_2$ layers were grown at a substrate temperature of 400° C. and oxygen partial pressure of 50 mTorr. After growth of the $SnO_2$ layer, the $VO_2$ layer was grown at the temperature of 400° C. and oxygen partial pressure of 18 mTorr. After growth, the $VO_2/SnO_2$ films were cooled down to room temperature at an oxygen partial pressure of 18 mTorr.

The structural qualities of the films were examined using high-resolution X-ray diffraction (XRD). The XRD pattern of the $VO_2/SnO_2/TiO_2$ film showed a clear film peak at $2\theta$=64.8° along with (002) diffraction peaks from the underlying rutile $SnO_2$ and $TiO_2$ substrate. This film peak comes from the ($\overline{4}$02) reflection of monoclinic $VO_2$, and these correspond with the (002) reflection of $VO_2$'s high-temperature rutile phase. No other peaks were observed using XRD analysis, proving that the $VO_2$ film was highly oriented and had a pure phase. The peak position (i.e., $2\theta$=64.7°) was almost identical to that of the ($\overline{4}$02) reflection for bulk, monoclinic $VO_2$, suggesting that the film was fully relaxed and had bulk-like lattices. Importantly, the $VO_2/SnO_2/TiO_2$ film exhibited a symmetric diffraction peak, well fitted with a single peak, implying that the misfit strain was abruptly relaxed without gradual strain relaxation. In contrast, the $VO_2/TiO_2$ film exhibited an asymmetrical diffraction peak, implying the presence of a gradual strain relaxation in the film, consistent with this study's initial predictions.

To obtain further information on lattice strains, X-ray reciprocal-space mappings (RSMs) were used. In the case of the $VO_2/TiO_2$ film, the film's RSM peak position (denoted by a closed, circle) was far from that of the $VO_2$'s bulk (denoted by a closed, star), indicating that the $VO_2$ film was still partially strained. Furthermore, the film's RSM peak featured a shoulder directed toward the bulk peak position, confirming gradual strain relaxation in the film. As for the $VO_2/SnO_2/TiO_2$ film, the peak position of the film was identical to that of the bulk $VO_2$. This indicates that the use of an $SnO_2$ template leads to homogeneous lattices, as well as to complete relaxation for the misfit strain in the $VO_2$ film.

Results

Figure 6A:
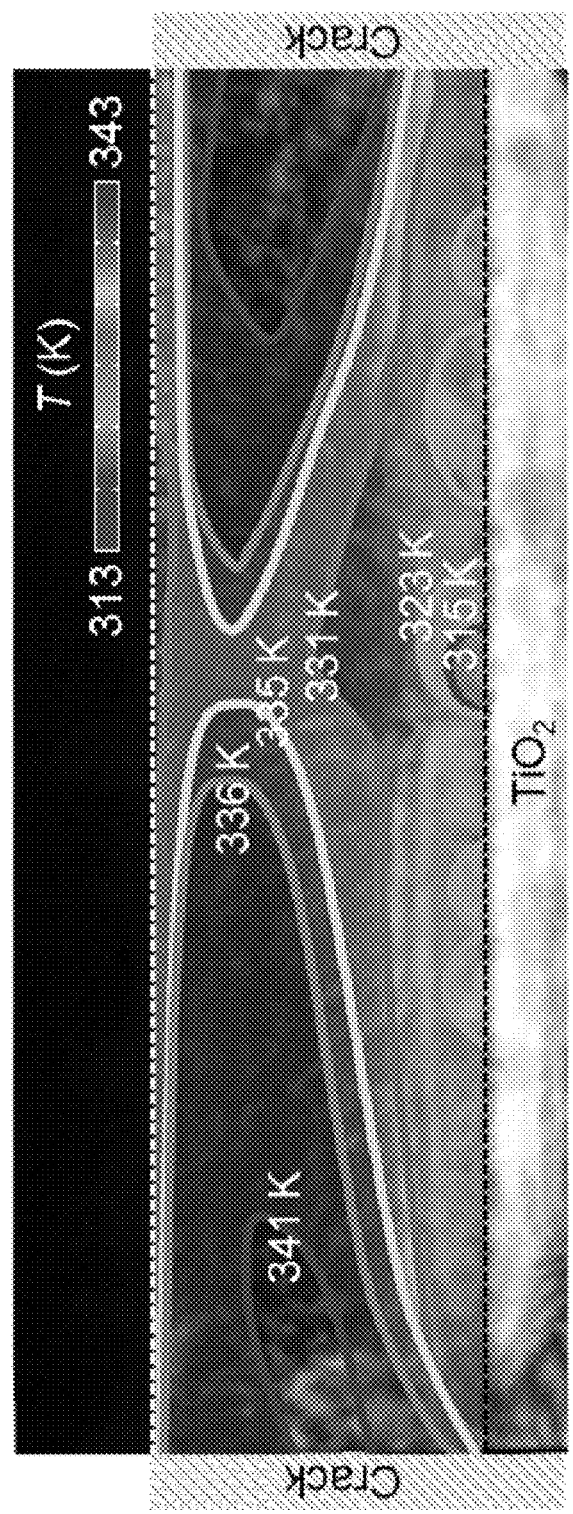
FIG. 6A. Monoclinic-to-rutile structural-phase transition upon heating, modeled using in situ TEM measurements of a 300-nm-thick $VO_2$ film on $TiO_2$. The phase boundaries between monoclinic and rutile structures at each temperature are represented using solid lines.
Figure 6B:
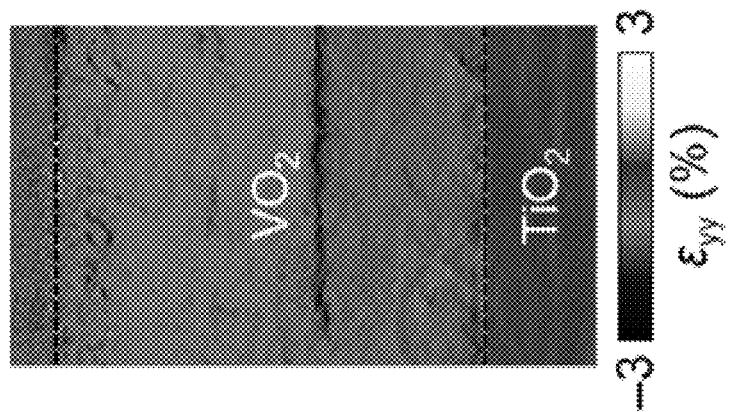
FIG. 6B. Spatial map of out-of-plane strain $\epsilon_{yy}$ for $VO_2$ films on $TiO_2$.
Figure 6C:
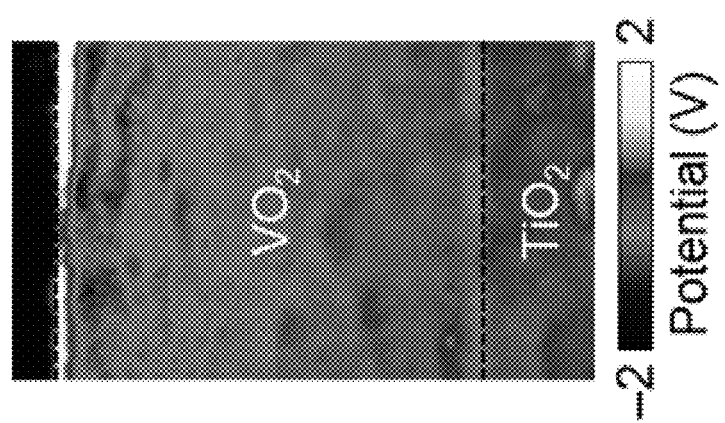
FIG. 6C. Spatial map of electrical potential for $VO_2$ films on $TiO_2$.
Figure 6E:
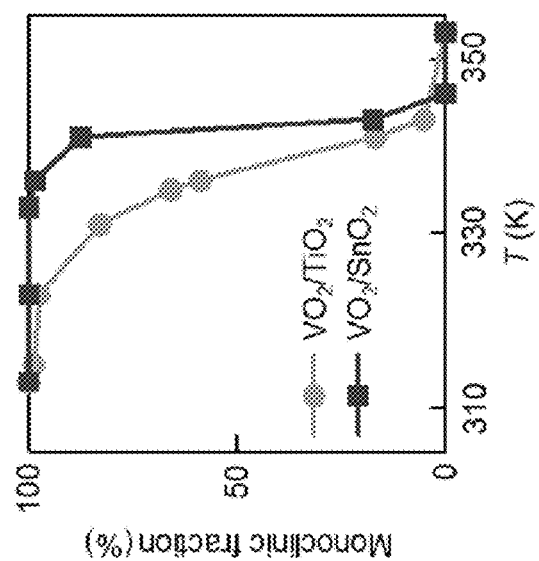
FIG. 6E. Monoclinic portion as a function of temperature T, as estimated based on the relative areas of the monoclinic regions in FIGS. 6A and 6D.

Based on initial predictions, structural inhomogeneity determined the MIT behavior of the $VO_2$ films. To visualize the role of local inhomogeneities on MIT, in situ transmission electron microscopy (TEM) was used. The monoclinic-to-rutile structural phase transition was monitored by heating the $VO_2$ films. Abrupt changes to lattice parameters (FIG. 5A), as well as to symmetry, during the phase transition caused noticeable contrast between the monoclinic and rutile regions, allowing clear visualization of the structural phase transition. For $VO_2$ films on bare $TiO_2$, the rutile phase started to nucleate from the interface at ~315 K, which is much lower than the nucleation point for bulk $T_{MIT}$ (i.e., 341 K), and the phase transition was complete near the surface and cracks. The local profile of the films' respective strains and electric potentials were measured using inline holography (FIGS. 6B, 6C), and there was a close relationship between local strain and $T_{MIT}$. However, whereas regions near the surface and cracks experienced negligible strain in the bulk-like $T_{MIT}$, the interfacial regions with relatively more strain preferred the rutile structure and had much lower $T_{MIT}$, resulting in a broad MIT (FIG. 6E).

Figure 6D:
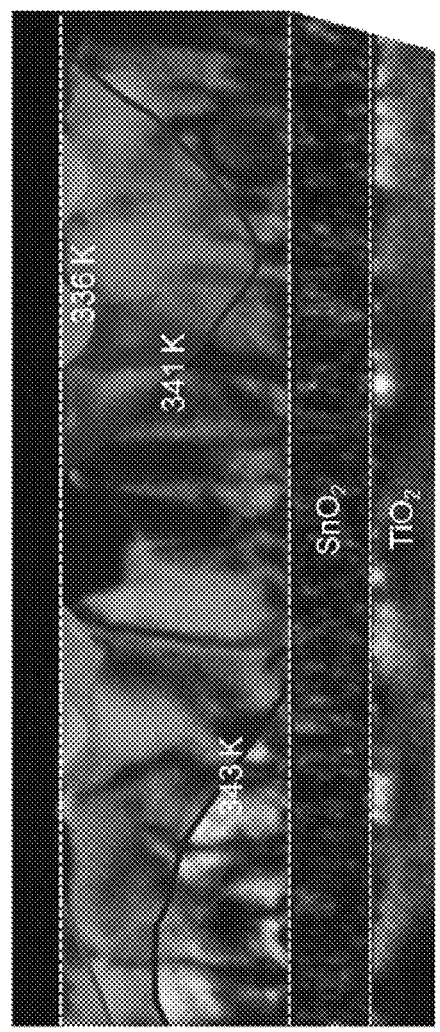
FIG. 6D. Monoclinic-to-rutile structural-phase transition upon heating a 300-nm-thick $VO_2$ film on an $SnO_2$-templated $TiO_2$.

In contrast, the $VO_2$ film on $SnO_2$-templated $TiO_2$ exhibited a much sharper, bulk-like phase transition and did not exhibit any structural or electronic inhomogeneities distinct from those of the $VO_2$ film on bare $TiO_2$. As a result, the $VO_2$ film on $SnO_2/TiO_2$ had a much sharper transition, and most of its structural-phase transition was complete between 341 and 343 K (FIGS. 6D, 6E). Interestingly, for the $VO_2$ film on $SnO_2/TiO_2$, the structural phase transition began at the surface and ended at the interface, which is the opposite of how the transition progresses in $VO_2$ films on bare $TiO_2$ (FIG. 6A). These phase-field simulations reveal that homogeneous $VO_2$ single crystals have a monoclinic-to-rutile phase transition that begins at the surface. Thus, the present study's in situ TEM and simulation results demonstrate that placing a $VO_2$ epitaxial film on an $SnO_2$-templated $TiO_2$ offers a more reliable, enhanced MIT, whose sharpness and magnitude are as good as those of intrinsic $VO_2$ single crystals.

Figure 7A:
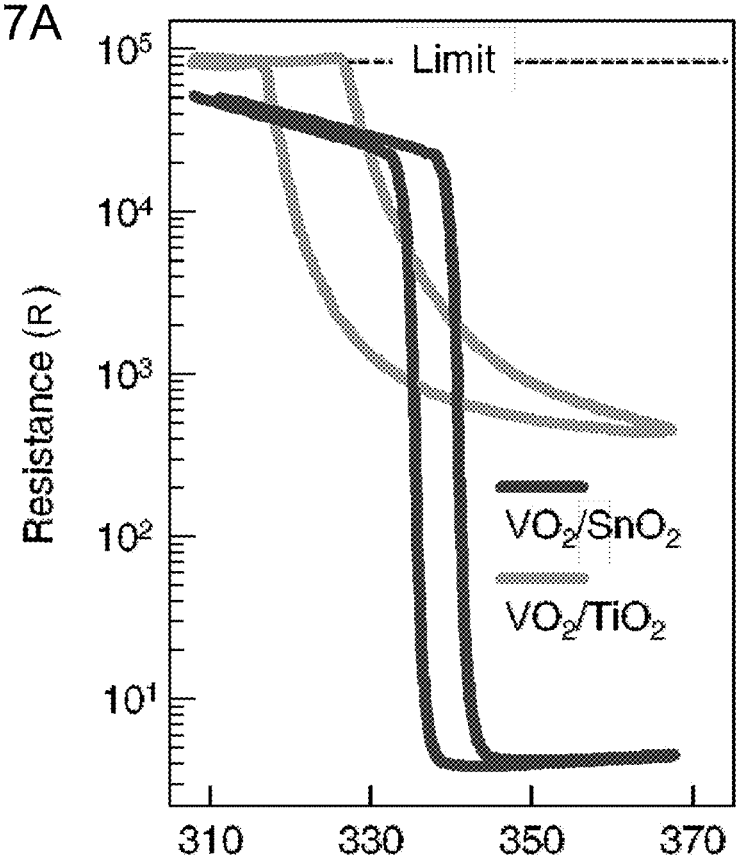
FIG. 7A. Resistance R versus temperature T for the $VO_2$ films of the Example.
Figure 7B:
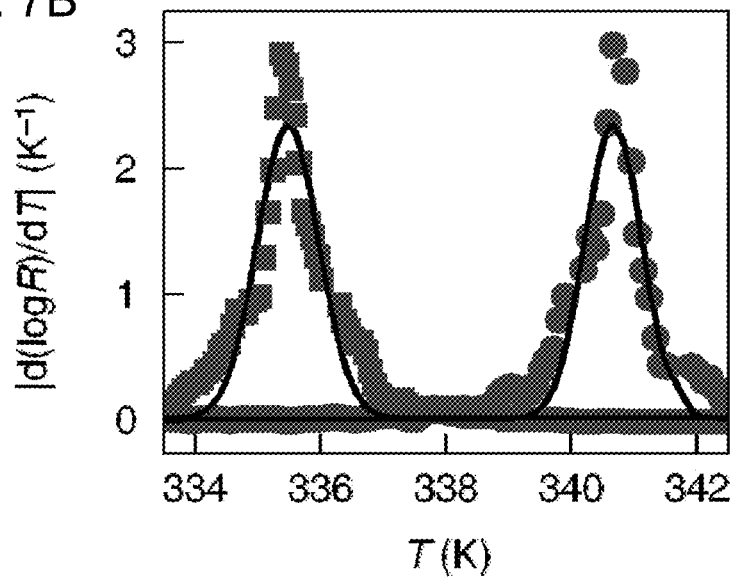
FIG. 7B. The derivative curves of R for a 300-nm-thick $VO_2$ film on an $SnO_2$-templated $TiO_2$ (closed circles and squares indicate derivatives of the R logarithm, as measured during heating and cooling, respectively; experimental data are fitted using Gaussian curves [solid lines]).

To characterize the MIT and its sharpness, electrical resistance was measured as a function of temperature in $VO_2$ films with or without an $SnO_2$ template (FIG. 7A). The resistance of the 300-nm-thick $VO_2$ film on the $SnO_2/TiO_2$ substrate caused a change of four orders of magnitude (i.e., ≥3×10$^6$%) during MIT, while the resistance change was drastically reduced in $VO_2$ films on bare $TiO_2$, possibly due to the presence of a strain gradient and cracks (FIGS. 9A and 9B). The transition temperature for the $VO_2/SnO_2/TiO_2$ film was ~341 K, the same as for the bulk $VO_2$. As FIG. 7A also clearly shows, the $VO_2/SnO_2/TiO_2$ film exhibited a much sharper MIT compared with films of the same thickness on bare $TiO_2$. The sharpness of the $VO_2/SnO_2/TiO_2$ film's MIT was quantitatively estimated to be <1 K using the width of its derivative curves (FIG. 7B). This MIT sharpness (i.e., ~0.5 K) is comparable to that of fully coherent, 10-nm-thick $VO_2$ films on bare $TiO_2$. Thus, this study's electrical-transport measurements indicate that homogeneity engineering using an $SnO_2$ template allows for a sharp, pronounced resistance change across MIT, while maintaining a bulk-like transition temperature.

Thus far, electrical-transport measurements have been used to determine the sharpness of the MIT. However, electrical conduction can be dominated by low-resistive local regions and associated short-circuit currents so that the transport measurements might not effectively reflect MIT sharpness for the overall film region. Because of this, optical measurements were adopted in addition to electrical measurements. Using spectroscopic ellipsometry, refractive index n and extinction coefficient k were measured as a function of temperature. It is known that the complex dielectric function and associated n and k exhibit a noticeable change during MIT. (See, J. B. Kana Kana et al., Opt. Commun. 284, 807 (2011).) Furthermore, in contrast to electrical measurements, measurements of n and k are governed by the averaged optical response for the whole film region, rather than for local regions alone. Thus, optical measurements of n and k effectively reveal genuine MIT features, such as sharpness, in $VO_2$ films.

FIGS. 7C-F show the values for n and k measured during heating as functions of temperature, as well as wavelength λ of incidental light for 300-nm-thick $VO_2$ films. For the $VO_2/SnO_2/TiO_2$ film (FIGS. 3C, 3D), n and k exhibited abrupt changes for every λ across MIT with a $T_{MIT}$ of ~341 K, and this was the same as with the bulk sample. This sharp transition in n and k is attributable to the film's homogeneous nature (FIG. 5C). And yet, for the $VO_2/TiO_2$ film (FIGS. 7E, 7F), n and k exhibited gradual changes across MIT with an average $T_{MIT}$ of ~320 K, and this is attributable to the film's local inhomogeneities (FIG. 5B). Furthermore, the lower average $T_{MIT}$ value compared with the bulk value is attributable to the film's average tensile strain. Thus, these optical measurements confirm that the $VO_2/SnO_2/TiO_2$ film had a sharp MIT, and they underscore the importance of homogeneity engineering in producing high-quality epitaxial $VO_2$ films.

Figure 8B:
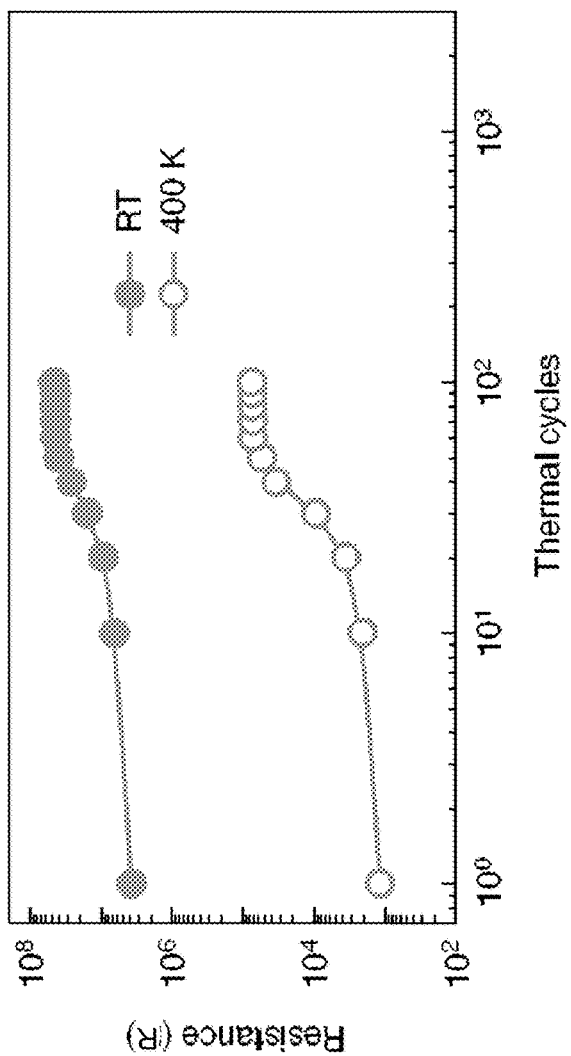
FIG. 8B. Resistance, measured at room temperature and 400 K, after repeated phase transitions of the $VO_2$ films without $SnO_2$ templates.
Figure 8A:
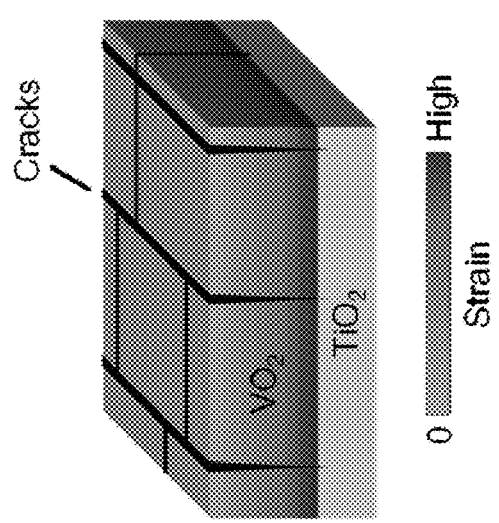
FIG. 8A. Schematic drawing showing strain relaxation and cracking in $VO_2$ films without $SnO_2$ templates; in the $VO_2$ film on an $SnO_2$-templated $TiO_2$, severe structural defects, such as strain relaxation and cracks, were well-confined to the interface, and this protects such films against degradation caused by repeated phase transitions.
Figure 8D:
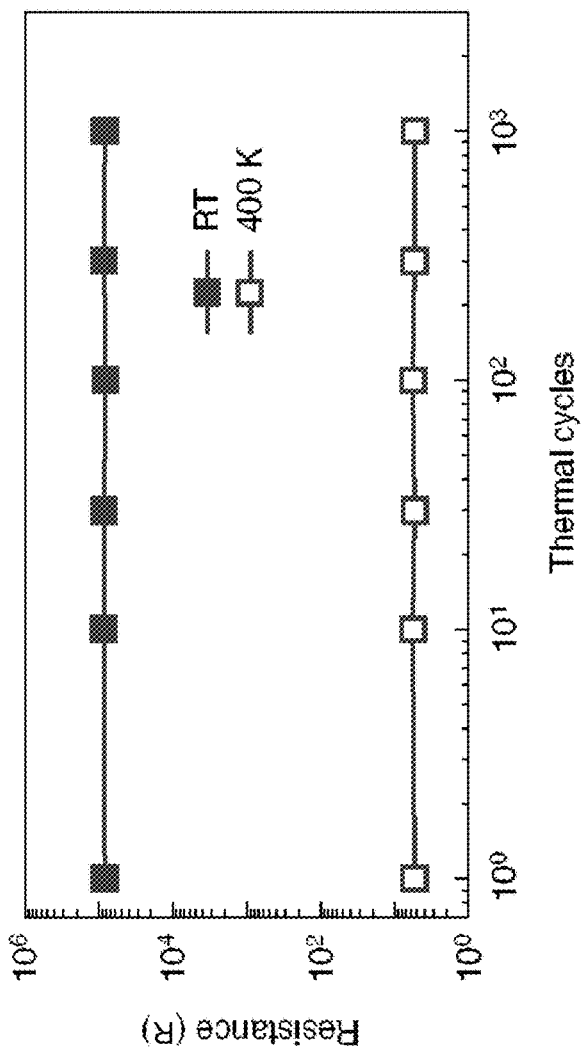
FIG. 8D. Resistance, measured at room temperature and 400 K, after repeated phase transitions of the $VO_2$ films with $SnO_2$ templates.
Figure 8C:
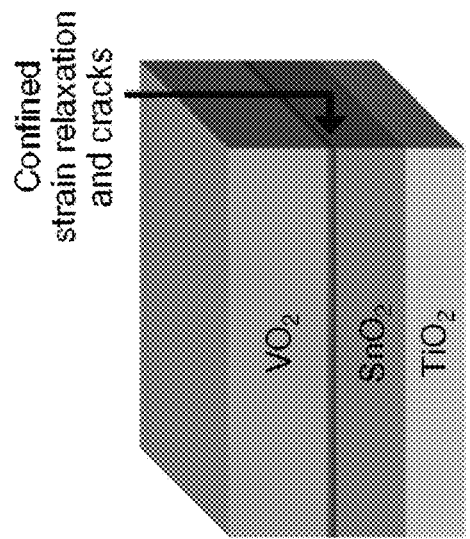
FIG. 8C. Schematic drawing showing strain relaxation and cracking in $VO_2$ films with $SnO_2$ templates; in the $VO_2$ film on an $SnO_2$-templated $TiO_2$, severe structural defects, such as strain relaxation and cracks, were well-confined to the interface, and this protects such films against degradation caused by repeated phase transitions.

Last, $SnO_2$ template's contributions were examined to prevent the $VO_2$ from cracking. $VO_2$ bulk crystals tend to crack under large amounts of stress during MIT, and they degrade upon repeat cycling. Strain relaxation in $VO_2$ epitaxial films can also cause such cracks (FIG. 8A). In this study, an increasing number of such cracks were formed after repeated thermal cycles, and they severely affected the MIT features of the $VO_2$ film on bare $TiO_2$. A more significant, increased resistance to cracks occurred during the nominally metallic phase, and as a result, the magnitude of resistance change across the MIT was far less, down to ~$10^5$%. On the other hand, the $VO_2$ films on $SnO_2/TiO_2$ had robust MITs, and the magnitude of their resistance change remained at ~$10^6$%, even after 1,000 cycles. This indicates that, once confined to the interface, structural defects like cracks don't spread into the films after repeated cycles with $VO_2/SnO_2/TiO_2$ films.

This example demonstrates thin-film epitaxy of structurally homogeneous, crack-free $VO_2$ with a sharp, reliable MIT grown using an $SnO_2$ template layer. Furthermore, correlated electron materials have exhibited various other novel phenomena in addition to the MIT, including superconductivity and colossal magnetoresistance—both of which are desirable for emerging electronics applications. These properties are, generally, strongly dependent on lattice strain due to a combination of charge, spin, orbitals, and degrees of lattice freedom. Thus, this study provides a general framework for predictively designing homogenous, heteroepitaxial materials with reliable electronic functions that include, but are not limited to, material MIT.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A layered oxide structure comprising:
   a substrate comprising single-crystalline $TiO_2$;
   an intervening layer comprising columnar, crystalline domains of rutile $SnO_2$ on the substrate, wherein the columnar, crystalline domains of $SnO_2$ have an epitaxial relationship with the single-crystalline $TiO_2$; and
   an overlayer comprising crystalline domains of $VO_2$ on the intervening layer, wherein the crystalline domains of $VO_2$ have an epitaxial relationship with the columnar, crystalline domains of rutile $SnO_2$;
   wherein the $VO_2$ has a metal-insulator phase transition critical temperature, below which the $VO_2$ has a monoclinic crystal structure and above which the $VO_2$ has a rutile crystal structure.

2. The structure of claim 1, wherein the metal-insulator phase transition critical temperature is in the range from 339 to 343 K.

3. The structure of claim 1, characterized in that, when the overlayer is heated from a temperature below its metal-insulator phase transition critical temperature to a temperature above its metal-insulator phase transition critical temperature, the $VO_2$ undergoes a phase transition from monoclinic to rutile with a transition sharpness of no greater than 2 K.

4. The structure of claim 3, characterized in that, when the overlayer is heated from a temperature below its metal-insulator phase transition critical temperature to a temperature above its metal-insulator phase transition critical temperature, the $VO_2$ undergoes a phase transition from monoclinic to rutile and the electrical resistance of the overlayer decreases by at least four orders of magnitude.

5. The structure of claim 1, characterized in that, when the overlayer is heated from a temperature below its metal-insulator phase transition critical temperature to a temperature above its metal-insulator phase transition critical temperature, the $VO_2$ undergoes a phase transition from monoclinic to rutile with a transition sharpness of no greater than 1 K.

6. The structure of claim 5, characterized in that, when the overlayer is heated from a temperature below its metal-insulator phase transition critical temperature to a temperature above its metal-insulator phase transition critical temperature, the $VO_2$ undergoes a phase transition from monoclinic to rutile and the electrical resistance of the overlayer decreases by at least four orders of magnitude.

7. The structure of claim 1, characterized in that, when the overlayer is heated from a temperature below its metal-insulator phase transition critical temperature to a temperature above its metal-insulator phase transition critical temperature, the $VO_2$ undergoes a phase transition from monoclinic to rutile and the electrical resistance of the overlayer decreases by at least four orders of magnitude.

8. The structure of claim 1, wherein the overlayer has a thickness in the range from 100 to 500 nm.

9. The structure of claim 8, wherein the overlayer has a thickness in the range from 200 to 400 nm.

10. A switch comprising:
a body comprising: a substrate comprising single-crystalline $TiO_2$; an intervening layer comprising columnar, crystalline domains of rutile $SnO_2$, wherein the columnar, crystalline domains of $SnO_2$ have an epitaxial relationship with the single-crystalline $TiO_2$; and a channel layer comprising crystalline domains of $VO_2$ on the intervening layer, wherein the crystalline domains of $VO_2$ have an epitaxial relationship with the columnar, crystalline domains of rutile $SnO_2$, and further wherein the $VO_2$ has a metal-insulator phase transition critical temperature, below which the $VO_2$ has a monoclinic crystal structure and above which the $VO_2$ has a rutile crystal structure;
a first electrically conducting contact in electrical communication with a first area of the channel layer;
a second electrically conducting contact in electrical communication with a second area of the channel layer; and
an external stimulus source configured to apply a metal-insulator phase transition-inducing external stimulus to the channel layer.

11. The switch of claim 10, wherein the external stimulus source configured to apply a metal-insulator phase transition-inducing external stimulus to the channel layer is an external voltage source configured to apply an external voltage to the first electrically conducting contact.

12. A method of switching using the switch of claim 11, the method comprising applying an external voltage from the external voltage source to the first electrically conducting contact, wherein the external voltage induces the $VO_2$ to undergo a phase transition from the electrically insulating monoclinic crystal structure to the electrically conducting rutile crystal structure.

13. A field effect switch comprising:
a body comprising: a substrate comprising single-crystalline $TiO_2$; an intervening layer comprising columnar, crystalline domains of rutile $SnO_2$, wherein the columnar, crystalline domains of $SnO_2$ have an epitaxial relationship with the single-crystalline $TiO_2$; and a channel layer comprising crystalline domains of $VO_2$ on the intervening layer, wherein the crystalline domains of $VO_2$ have an epitaxial relationship with the columnar, crystalline domains of rutile $SnO_2$, and further wherein the $VO_2$ has a metal-insulator phase transition critical temperature, below which the $VO_2$ has a monoclinic crystal structure and above which the $VO_2$ has a rutile crystal structure;
a source;
a drain, wherein the source and drain are connected by the channel layer;
a gate stack comprising: a gate oxide on the channel and a gate contact on the gate oxide; and
an external voltage source configured to apply a metal-insulator phase transition-inducing external voltage to the gate contact.

14. A method of switching using the switch of claim 13, the method comprising:
applying a gate voltage from the external voltage source to the gate contact, wherein the external voltage induces the $VO_2$ to undergo a phase transition from the electrically insulating monoclinic crystal structure to the electrically conducting rutile crystal structure.

15. A method of making a layered oxide structure, the method comprising:
epitaxially growing a layer of columnar, crystalline domains of rutile $SnO_2$, on a substrate comprising single-crystalline $TiO_2$; and
epitaxially growing an overlayer comprising crystalline domains of $VO_2$ on the layer of columnar, crystalline domains of rutile $SnO_2$.

* * * * *

UNITED STATES PATENT AND TRADEMARK OFFICE
CERTIFICATE OF CORRECTION

| | | |
|---|---|---|
| PATENT NO. | : 9,627,490 B1 | Page 1 of 1 |
| APPLICATION NO. | : 14/974178 | |
| DATED | : April 18, 2017 | |
| INVENTOR(S) | : Eom et al. | |

It is certified that error appears in the above-identified patent and that said Letters Patent is hereby corrected as shown below:

In the Specification

Column 7, Line 33:
Delete "low miscut 0.1°)" and replace with --low miscut (< 0.1°)--

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*